US008494819B2

(12) United States Patent
Hallquist (10) Patent No.: US 8,494,819 B2
(45) Date of Patent: Jul. 23, 2013

(54) EFFICIENT DATA MANAGEMENT FOR SHELL FINITE ELEMENTS REPRESENTING LAYERED COMPOSITE MATERIALS

(75) Inventor: John O. Hallquist, Livermore, CA (US)

(73) Assignee: Livermore Software Technology Corp., Livermore, CA (US)

(*) Notice: Subject to any disclaimer, the term of this patent is extended or adjusted under 35 U.S.C. 154(b) by 587 days.

(21) Appl. No.: 12/868,660

(22) Filed: Aug. 25, 2010

(65) Prior Publication Data
US 2012/0053907 A1  Mar. 1, 2012

(51) Int. Cl.
*G06F 17/50* (2006.01)
*G06F 7/60* (2006.01)
*G06G 7/48* (2006.01)

(52) U.S. Cl.
USPC ........................................ 703/2; 703/1; 703/6

(58) Field of Classification Search
None
See application file for complete search history.

(56) References Cited

U.S. PATENT DOCUMENTS

| | | | |
|---|---|---|---|
| 5,984,511 A * | 11/1999 | Vasey-Glandon et al. | 703/6 |
| 6,044,210 A * | 3/2000 | Nagtegaal | 703/2 |
| 6,341,261 B1 * | 1/2002 | Vasey-Glandon et al. | 703/6 |
| 6,721,684 B1 * | 4/2004 | Saebi | 702/183 |
| 7,010,472 B1 * | 3/2006 | Vasey-Glandon et al. | 703/6 |
| 7,127,380 B1 * | 10/2006 | Iverson et al. | 703/2 |
| 7,376,540 B2 * | 5/2008 | Onodera et al. | 703/1 |
| 7,451,067 B2 * | 11/2008 | Itou et al. | 703/2 |
| 7,505,885 B2 * | 3/2009 | Deobald et al. | 703/7 |
| 7,822,584 B1 * | 10/2010 | Saebi | 703/1 |
| 7,877,237 B1 * | 1/2011 | Saebi | 703/1 |
| 7,979,257 B2 * | 7/2011 | Yu et al. | 703/9 |
| 8,200,458 B2 * | 6/2012 | Hallquist et al. | 703/1 |
| 2005/0065989 A1 * | 3/2005 | Akiba et al. | 708/446 |
| 2006/0235660 A1 * | 10/2006 | Chi | 703/2 |
| 2009/0271156 A1 * | 10/2009 | Kageura | 703/1 |
| 2009/0326883 A1 * | 12/2009 | Mizutani et al. | 703/2 |
| 2010/0023279 A1 * | 1/2010 | Sviercoski | 702/45 |
| 2011/0172803 A1 * | 7/2011 | Suzuki et al. | 700/103 |

OTHER PUBLICATIONS

Ribeiro et al. "Comparison between element, edge and compressed storage schemes for iterative solutions in finite element analyses", Int. J. Numer. Meth. Engng 2005; 63:569-588.*
Datta et al. "Three-dimensional Finite Element Formulation and Scalable Domain Decomposition for High Fidelity Rotor Dynamic Analysis", 2010.*
Araujo et al. "Boundary-element parallel-computing algorithm for the microstructural analysis of general composites", Computers and Structures 88 (2010) 773-784.*

(Continued)

*Primary Examiner* — Shambhavi Patel
(74) *Attorney, Agent, or Firm* — Roger H. Chu (57) ABSTRACT

Methods and systems for obtaining numerically simulated structural behaviors of layered composite materials within a structure in a time-marching simulation using finite element analysis (FEA) are disclosed. A single identifier is used for designating all shell finite elements representing parts or components made of layered composite materials in a FEA model of a structure by user. Layered composite materials may have arbitrary number of layers. Each layer may have different material orientation/angle or fiber direction, thickness, and structural material behaviors. Each shell element representing composite material includes a set of through-thickness integration points with each corresponding to one layer of the layered composite materials. The shell elements are sorted by types into a number of internal groups to facilitate vectorization and/or more optimal domain decomposition in massive parallel processing. The internal groups are configured to be hidden from the user and stored in contiguous memory locations when conducting a FEA.

13 Claims, 6 Drawing Sheets

OTHER PUBLICATIONS

Dayde et al. "On the Use of Element-by-Element Preconditioners to Solve Large Scale Partially Separable Optimization Problems", 1995.*

Hughes et al. "Fully Vectrorized EBE Preconditioners for Nonlinear Solid Mechanics: Applications to Large-Scale Three-Dimensional Continuum, Shell, and Contact/Impact Problems", Oct. 2009.*

Mathur, et al. "Massively Parallel Computing Unstructured Finite Element Simulations", Mar. 1993.*

Rao et al. "Comparative efficiencies of three parallel algorithms for nonlinear implicit transient dynamic analysis", Sadhana vol. 29, Part 1, Feb. 2004, pp. 57-81.*

Liu et al. "Adistributed memory parallel element-by-element scheme based on Jacobi-conditioned conjugate gradient for 3D finite element analysis", Finite Elements in Analysis and Design 43 (2007) 494-503.*

* cited by examiner

EFFICIENT DATA MANAGEMENT FOR SHELL FINITE ELEMENTS REPRESENTING LAYERED COMPOSITE MATERIALS

FIELD OF THE INVENTION

The present invention generally relates to computer-aided engineering analysis of a structure or product having components/parts made of composite materials, more particularly to efficient data management for shell finite elements representing layered composite materials in finite element analysis.

BACKGROUND OF THE INVENTION

Figure 1:
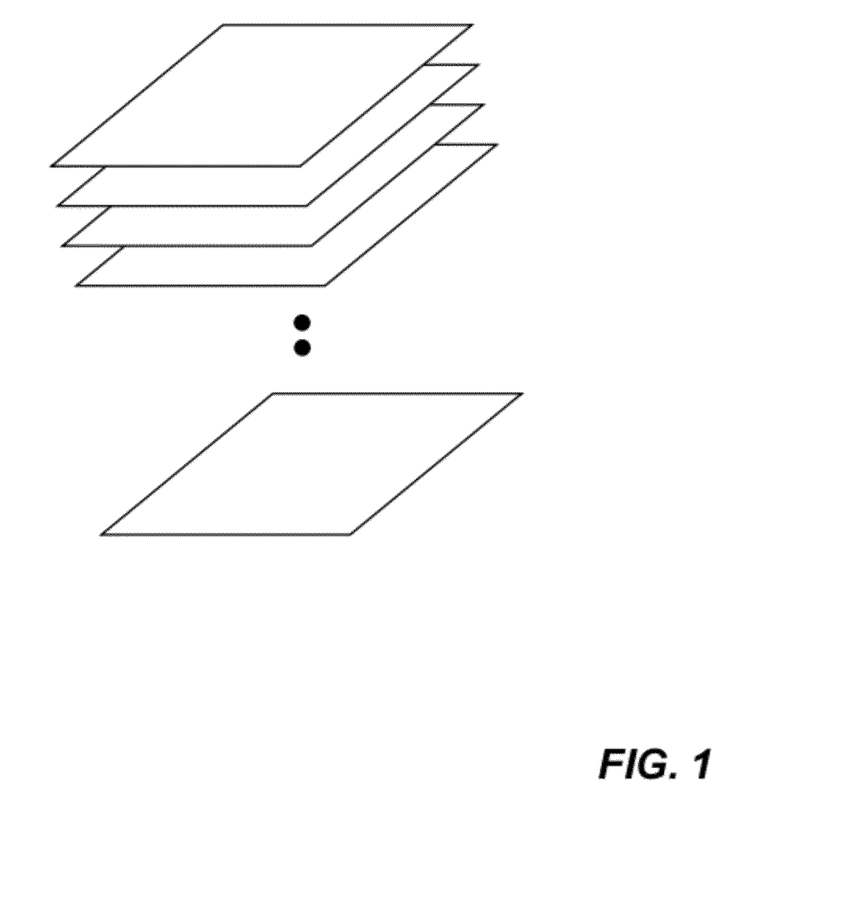
FIG. 1 is an exploded perspective view showing a portion of exemplary layered composite material.

Layered composite materials have been used in many applications in engineering products from a patio to an airplane. When building an aircraft, for example, engineers need lightweight, strong material that can insulate and protect passengers while surfacing the aircraft. An aircraft made of pure metal could fail catastrophically if a small crack appeared in the skin of the airplane. On the other hand, aircraft integrating reinforced composite materials such as fiberglass, graphite, and other hybrids will be stronger and less likely to break up. Layered composite materials comprise an arbitrary number of layers or plies as shown in FIG. 1.

Finite element analysis (FEA) is a computer implemented method widely used in industry to model and solve engineering problems relating to complex systems such as three-dimensional, non-linear structural design, and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells, and beams of various sizes, which are called elements. The vertices of the elements are referred to as nodes. The model is comprised of a finite number of elements, which are assigned a material identifier to associate with its material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

Using FEA to numerically simulate structural behaviors of layered composite materials contained in a structure can be done with existing technologies (i.e., FEA application module executed in a computer system). However, there is a problem for prior art approaches. In particular, this problem occurs when a large number of different composite materials are used in a structure (e.g., modern aircraft) or when the number of layers and their material properties change continuously throughout a given structural component. The user (e.g., engineers and/or scientists) prefer to reference the given structural component with one identifier in the FEA model, but they are required to identify elements that have identical number of layers and material properties associated with the layers and give them a unique identifier. Thus, a given component is broken up into multiple parts with each part made up of disjoint element groups with one or more elements per group. For example, the prior art approach is tedious, manual and/or semi-manual ad-hoc and often confusing for the user. Not only is the prior art approach time-consuming, it is also error-prone and requires additional effort when the computation output is analyzed.

A related problem associated with the prior art approach is that efficient computer processing techniques such as vectorization and domain decomposition in massive parallel processing cannot be applied optimally when parts use layered composite materials that vary continuously in the number of layers and material properties. For this to occur, the elements of each unique part identifier must be processed together, which implies that the number of layers and material properties must be the same and the elements are stored in contiguous memory locations. However, these shell finite elements are often scattered in the FEA model. Efficient massive parallel processing requires load balancing across all processors. In composite shell finite elements, the time required to process each shell element is proportion to the number of layers which can lead to unbalanced processor loads depending upon the element distribution in the FEA model.

Therefore, it would be desirable to have an improved method for obtaining numerically simulated structural behaviors of layered composite materials contained in a structure in a time-marching simulation using finite element analysis.

BRIEF SUMMARY OF THE INVENTION

This section is for the purpose of summarizing some aspects of the present invention and to briefly introduce some preferred embodiments. Simplifications or omissions in this section as well as the abstract and the title herein may be made to avoid obscuring the purpose of the section. Such simplifications or omissions are not intended to limit the scope of the present invention.

The present invention discloses a system, method and software product for obtaining numerically simulated structural behaviors of layered composite materials within a structure in a time-marching simulation using finite element analysis (FEA). According to one aspect of the present invention, a single identifier (e.g., composite material identifier, or special part ID, etc.) is used for designating all shell finite elements representing parts or components made of layered composite materials in a FEA model of a structure by user. Layered composite materials may have arbitrary number of layers. Each layer may have different material orientation/angle or fiber direction, thickness, and structural material behaviors (e.g., elastic, plastic, viscoelastic, anisotropic, etc.). Each shell element representing composite material includes a set of through-thickness integration points with each corresponding to one layer of the layered composite materials.

According to another aspect, all shell finite elements identified with the composite material identifier in a FEA model are sorted by types into a number of internal groups to facilitate vectorization and/or more optimal domain decomposition in massive parallel processing. Internal groups are hidden from the user, who does not need to provide any input as to how the internal groups are formed or created. The internal groups are configured to occupy contiguous memory locations when conducting a FEA using the FEA model with such internal groups created therein.

According to another aspect, layer composite materials are represented and numerically simulated using shell finite elements with a number of theoretical bases. In other words, the present invention does not limit shell finite element to a particular or special theory, any underlined numerical finite element theory for the formulation of the shell finite element can be applied.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 2-7. However, those skilled in the art will readily appreciate that the detailed description given herein with respect to these figures is for explanatory purposes as the invention extends beyond these limited embodiments.

Figure 2:
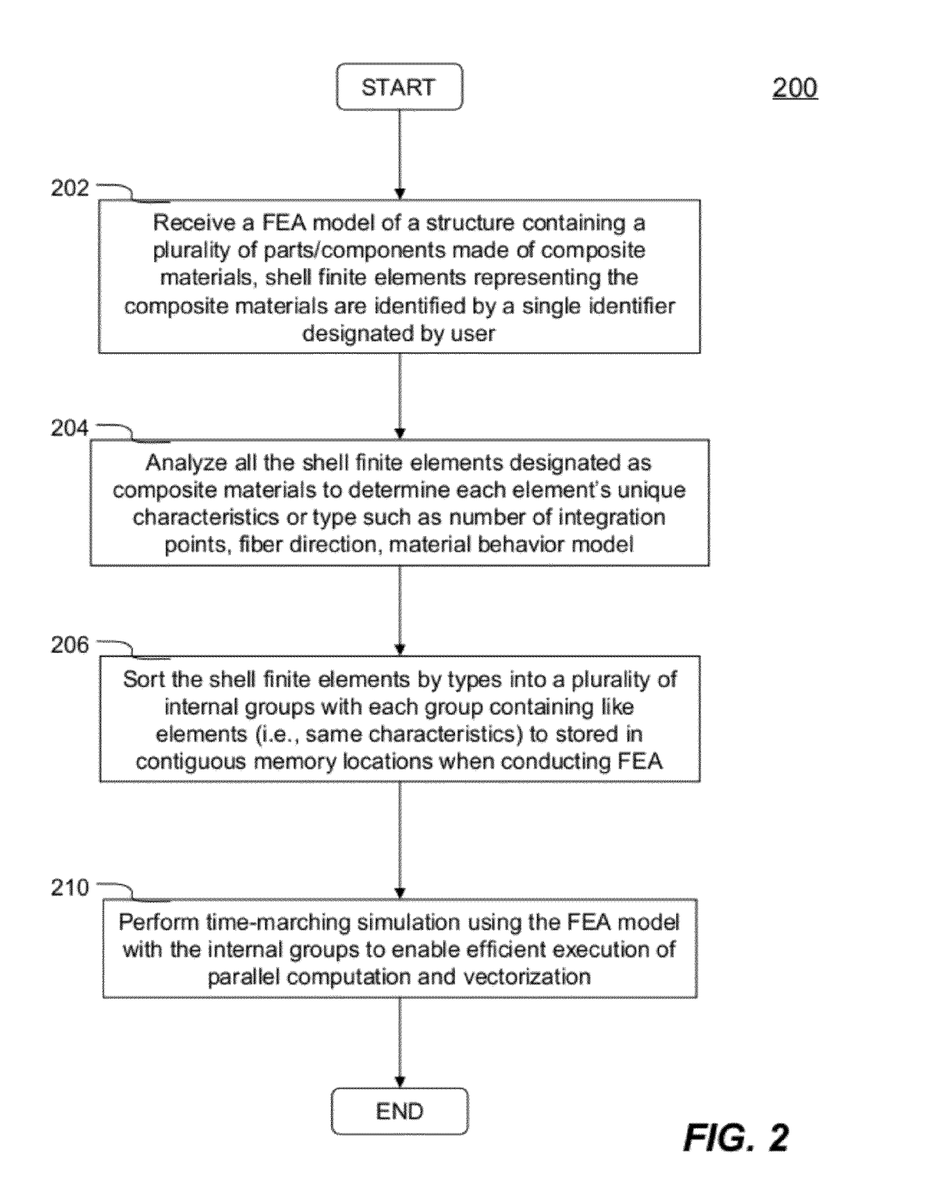
FIG. 2 is a flowchart illustrating an exemplary process executed in a computer system for obtaining numerically simulated structural behaviors of layered composite materials within a structure in a time-marching simulation using finite element analysis, according to an embodiment of the present invention.
Figure 3:
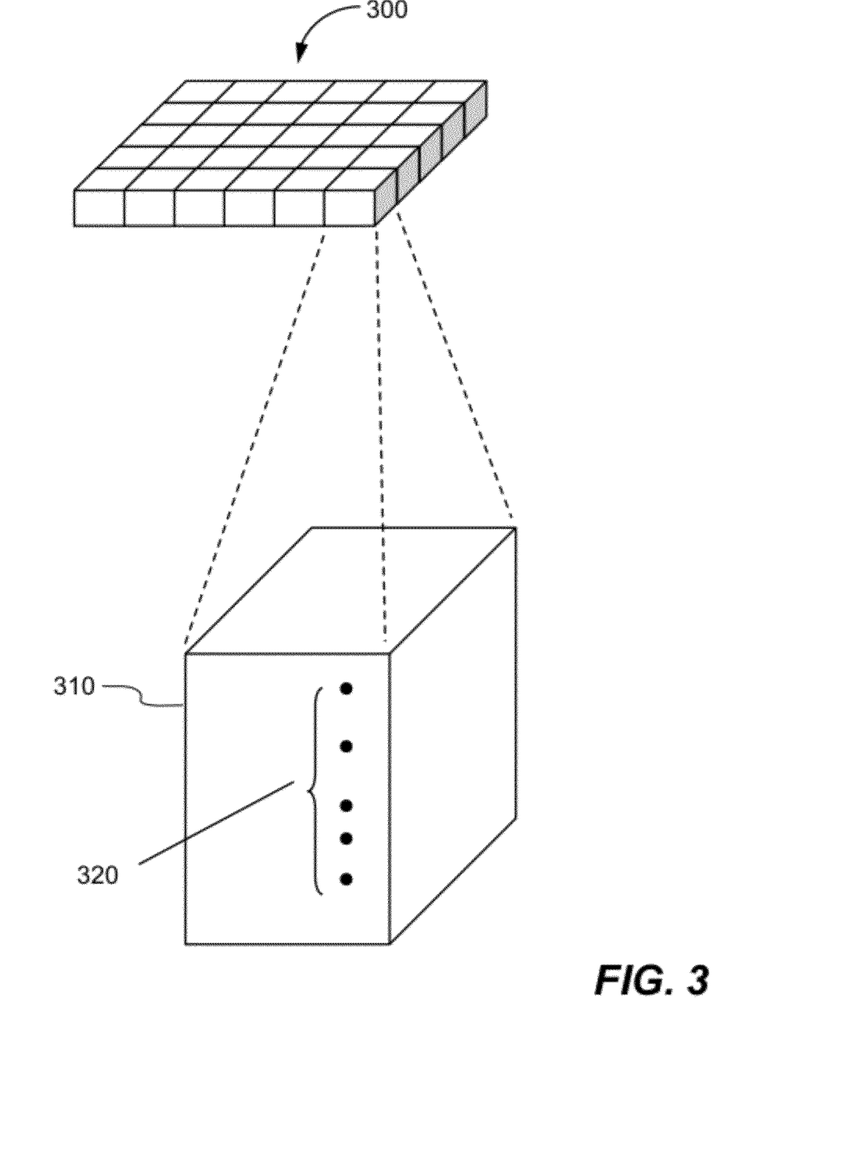
FIG. 3 is a perspective view showing exemplary shell finite elements representing components or parts of a structure, the components or parts are made of composite materials, according to an embodiment of the present invention.

Referring first to FIG. 2, it is shown a flowchart illustrating an exemplary process 200 executed in a computer system for obtaining numerically simulated structural behaviors of layered composite materials within a structure in a time-marching simulation using finite element analysis, according to an embodiment of the present invention. Process 200 is preferably implemented in software.

Figure 4A:
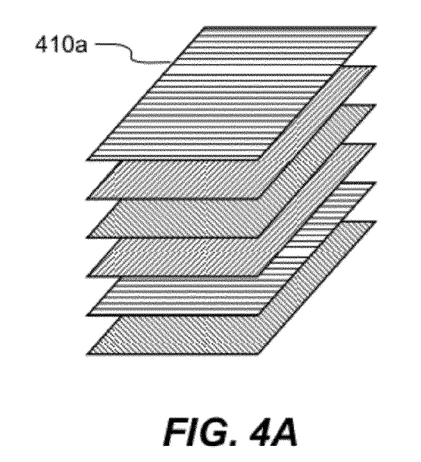
FIGS. 4A-4B are exploded perspective views showing two exemplary composite materials having different number of layers and different material orientation/angle or fiber direction in accordance with one embodiment of the present invention.
Figure 4B:
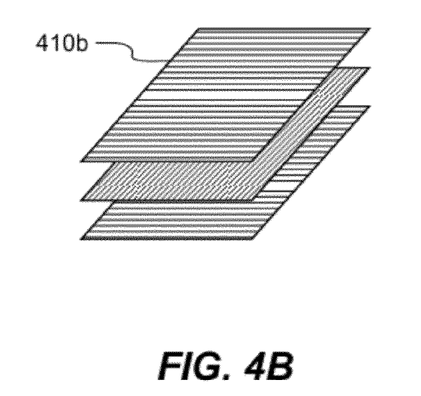
Figure 5A:
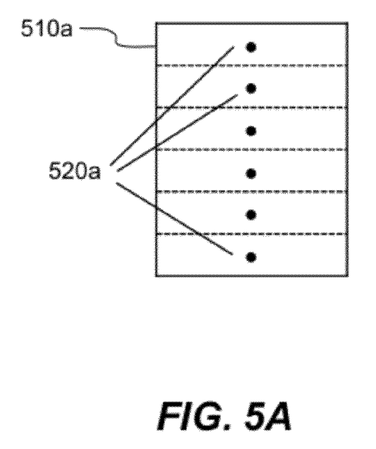
FIGS. 5A-5B are side views of exemplary shell finite elements in accordance with one embodiment of the present invention.
Figure 5B:
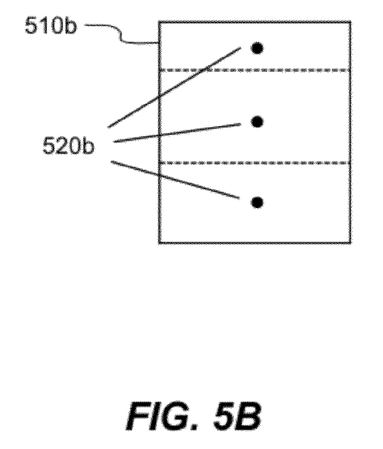
Figure 6A:
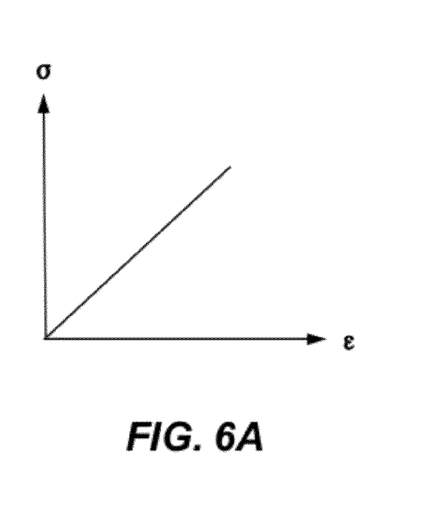
FIGS. 6A-6D are diagrams showing various exemplary material behavior models that can be implemented at integration points within the shell finite elements of FIG. 3.
Figure 6B:
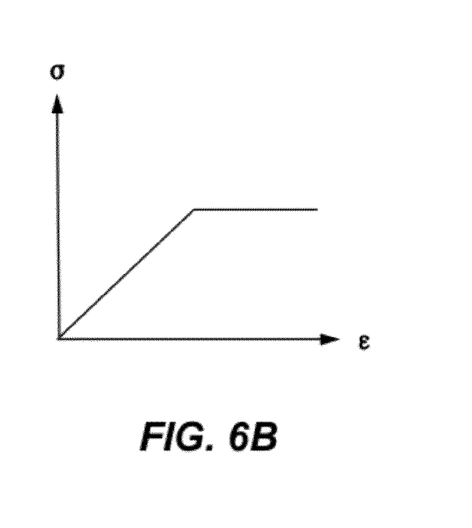
Figure 6C:
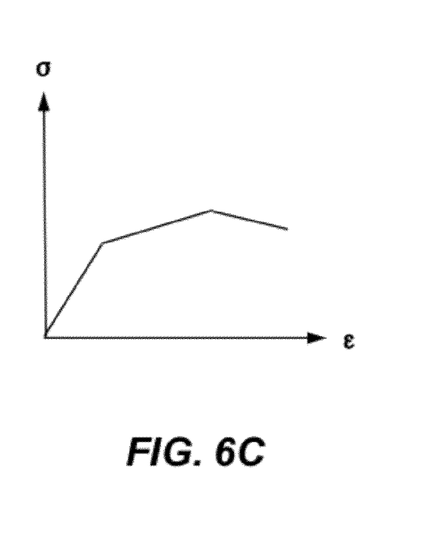
Figure 6D:
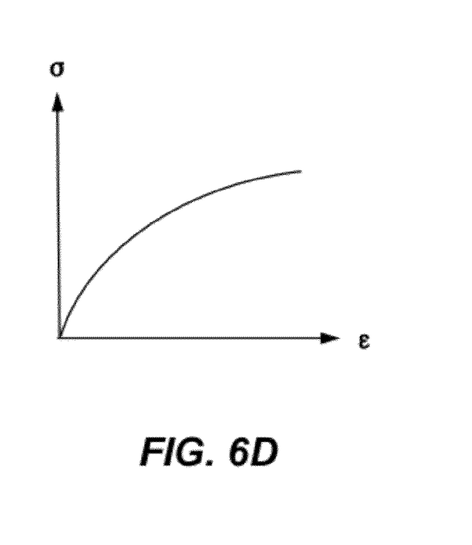

Process 200 starts by receiving a finite element analysis (FEA) model of a structure (e.g., airplane, car, consumer products, etc.) at step 202. The structure contains parts or components made of one or more types of layered composite materials. Each component/part made of layered composite material is represented by shell finite elements 300 (e.g., three-dimension shell element or thick shell element) shown in FIG. 3. Each shell element 310 is configured with arbitrary number of through-thickness integration points 320 with each point corresponding to one layer of the layered composite material. Each integration point 420 is configured with a set of characteristics such as thickness of the layer, material behavior model of the layer, material orientation/angle or fiber direction of the layer. For example, FIGS. 4A-4B show two different types of layered composite materials 410a-b. The first composite material 410a has six layers, while the second composite material 410b has three. In addition, the first and second composite materials 410a-b have their own specific combination of material angles/orientations or fiber directions (indicated by different shade directions). Furthermore, FIGS. 5A-5B show side views of respective shell elements 510a-b representing the first and second composite materials 410a-b. Shell finite element 510a is configured with six through-thickness integration points 520a, each point is associated with a thickness of the layer it represents (layers are indicated by dotted lines). It is shown that all six layers have same thickness. Shown in FIG. 5B, shell finite element 510b is configured with three integration points 520b each associated with different thickness.

Finally, each integration point is configured with a material behavior model. FIGS. 6A-6D shows four exemplary material behavior models (i.e., stress-strain ($\sigma$-$\epsilon$) relationship), elastic (FIG. 6A), elastic-plastic (FIG. 6B), multi-linear (FIG. 6C) and viscoelastic (FIG. 6D) that can be used. Additionally, material can be isotropic or anisotropic. The material behavior models can be represented by mathematical expression referred to as a constitutive equation. For layered composite material, each layer can be configured with a material behavior model that is different other layers. A large number of different combinations can result, thereby becoming very complex in a FEA model especially if user needs to manually keep tracking them. The present invention allows user to designate all types of composite material with one single identifier (e.g., a part ID, a composite material identifier, etc.) without compromising efficiency.

Next, at step 204, all of the shell finite elements that are designated as composite materials are analyzed. Each shell element's characteristics or type are determined, for example, number of integration points (i.e., number of layers), material orientation or fiber direction, material behavior model.

Then, the shell finite elements are sorted by types into a plurality of internal groups at step 206. Each group contains like elements (i.e., same type of elements) such that elements of the same type are internally grouped together to occupy a contiguous memory space when conducting FEA using the FEA model with these internally sorted groups. To ensure that the sizes of these groups are the maximum possible, the thickness of the composite layers and material fiber orientations can vary within the element groups. For computation performance enhancing techniques such as vectorization and optimal domain decomposition in massive parallel processing, it is vital to have such data arrangement in a computer system. When data of like elements are stored in contiguous memory locations, full vectorization can be achieved using special hardware (e.g., special instruction data pipes) in a state-of-the-art supercomputing architecture. As for massive parallel processing, more accurate estimate of the computational costs can be achieved, thereby leading to better optimized domains for load balancing therefore optimal performance.

Finally, at step 210, a time-marching simulation of the structure can be conducted with high computation efficiency using the FEA model with internally sorted groups. It is noted the internally sorted groups are hidden from the user. All user needs to do is to specify all shell finite elements with a single composite material identifier. Upon reporting simulation results back to the user, these internal groups are remapped back to the original order so that user can examine them with the same logic.

Figure 7:
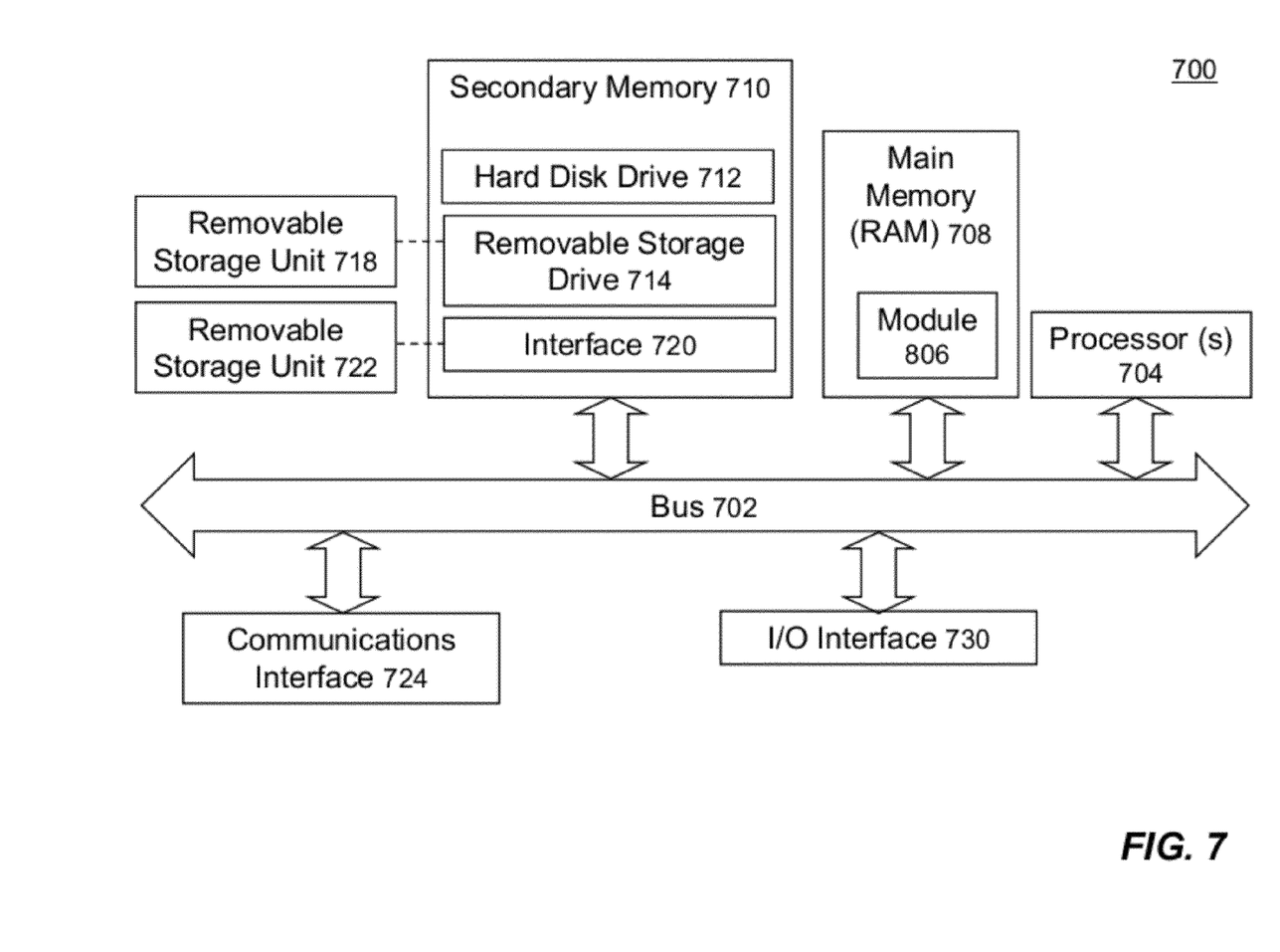
FIG. 7 is a function diagram showing salient components of a computing device, in which an embodiment of the present invention may be implemented.

According to one aspect, the present invention is directed towards one or more computer systems capable of carrying out the functionality described herein. An example of a computer system 700 is shown in FIG. 7. The computer system 700 includes one or more processors, such as processor 704. The processor 704 is connected to a computer system internal communication bus 702. Various software embodiments are described in terms of this exemplary computer system. After reading this description, it will become apparent to a person skilled in the relevant art(s) how to implement the invention using other computer systems and/or computer architectures.

Computer system 700 also includes a main memory 708, preferably random access memory (RAM), and may also include a secondary memory 710. The secondary memory 710 may include, for example, one or more hard disk drives 712 and/or one or more removable storage drives 714, representing a floppy disk drive, a magnetic tape drive, an optical disk drive, etc. The removable storage drive 714 reads from and/or writes to a removable storage unit 718 in a well-known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative embodiments, secondary memory 710 may include other similar means for allowing computer programs or other instructions to be loaded into computer system 700. Such means may include, for example, a removable storage unit 722 and an interface 720. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 722 and interfaces 720 which allow software and data to be transferred from the removable storage unit 722 to computer system 700. In general, Computer system 700 is controlled and coordinated by operating system (OS) software, which performs tasks such as process scheduling, memory management, networking and I/O services.

There may also be a communications interface 724 connecting to the bus 702. Communications interface 724 allows software and data to be transferred between computer system 700 and external devices. Examples of communications interface 724 may include a modem, a network interface (such as an Ethernet card), a communications port, a Personal Computer Memory Card International Association (PCMCIA) slot and card, etc. Software and data transferred via communications interface 724 are in the form of signals 728 which may be electronic, electromagnetic, optical, or other signals capable of being received by communications interface 724. The computer 700 communicates with other computing devices over a data network based on a special set of rules (i.e., a protocol). One of the common protocols is TCP/IP (Transmission Control Protocol/Internet Protocol) commonly used in the Internet. In general, the communication interface 724 manages the assembling of a data file into smaller packets that are transmitted over the data network or reassembles received packets into the original data file. In addition, the communication interface 724 handles the address part of each packet so that it gets to the right destination or intercepts packets destined for the computer 700. In this document, the terms "computer program medium" and "computer usable medium" are used to generally refer to media such as removable storage drive 714, and/or a hard disk installed in hard disk drive 712. These computer program products are means for providing software to computer system 700. The invention is directed to such computer program products.

The computer system 700 may also include an input/output (I/O) interface 730, which provides the computer system 700 to access monitor, keyboard, mouse, printer, scanner, plotter, and alike.

Computer programs (also called computer control logic) are stored as application modules 706 in main memory 708 and/or secondary memory 710. Computer programs may also be received via communications interface 724. Such computer programs, when executed, enable the computer system 700 to perform the features of the present invention as discussed herein. In particular, the computer programs, when executed, enable the processor 704 to perform features of the present invention. Accordingly, such computer programs represent controllers of the computer system 700.

In an embodiment where the invention is implemented using software, the software may be stored in a computer program product and loaded into computer system 700 using removable storage drive 714, hard drive 712, or communications interface 724. The application module 706, when executed by the processor 704, causes the processor 704 to perform the functions of the invention as described herein.

The main memory 708 may be loaded with one or more application modules 706 that can be executed by one or more processors 704 with or without a user input through the I/O interface 730 to achieve desired tasks. In operation, when at least one processor 704 executes one of the application modules 706, the results are computed and stored in the secondary memory 710 (i.e., hard disk drive 712). The status of the finite element analysis (e.g., simulation of a structure having parts made of composite materials) is reported to the user via the I/O interface 730 either in a text or in a graphical representation Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas only a couple of exemplary layered materials have been shown and described, other types of layered materials can also be simulated with the present invention. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A method for obtaining numerically simulated structural behaviors of layered composite materials within a structure in a time-marching simulation using finite element analysis (FEA), said method comprising:
receiving, in a computer system, a FEA model of a structure containing more than one type of layered composite materials represented by a plurality of shell finite elements, wherein said plurality of shell finite elements are each identified with a single identifier defined by a user that are identified with a single identifier defined by user;
sorting the shell finite element elements by types into a plurality of internal groups in the computer system such that those shell finite elements in each group are resided in contiguous memory locations of the computer system's main memory when a time-marching simulation of the structure is conducted using computer performance enhancement techniques specifically applying to said those shell finite elements, wherein each of the shell finite elements is configured with an arbitrary number of through-thickness integration points with each integration point corresponding to one layer of the layered composite material; and
obtaining a time-history of structural responses including behaviors of the layered composite materials from the time-marching simulation.

2. The method of claim 1, said corresponding layer is characterized with thickness and material orientation or fiber direction.

3. The method of claim 1, each of the integration points contains specific material behavior model.

4. The method of claim 3, said model behavior model includes one of elastic, plastic, anisotropic, multi-linear and viscoelastic.

5. The method of claim 1, said computer performance enhancing techniques comprise a full vectorization computation of said those shell finite elements.

6. The method of claim 1, said computer performance enhancing techniques comprise a more optimal domain decomposition estimate in parallel processing of said those shell finite elements.

7. The method of claim 1, said plurality of internal groups is hidden from the user.

8. A non-transitory computer-readable storage medium containing instructions for controlling a computer system obtaining numerically simulated structural behaviors of layered composite materials within a structure in a time-marching simulation using finite element analysis (FEA) by a method comprising:
receiving, in a computer system, a FEA model of a structure containing more than one type of layered composite materials represented by a plurality of shell finite elements wherein said plurality of shell finite elements are each identified with a single identifier defined by a user that are identified with a single identifier defined by user;
sorting the shell finite element elements by types into a plurality of internal groups in the computer system such that those shell finite elements in each group are resided in contiguous memory locations of the computer system's main memory when a time-marching simulation of the structure is conducted using computer performance enhancement techniques specifically applying to said those shell finite elements, wherein each of the shell finite elements is configured with an arbitrary number of through-thickness integration points with each integration point corresponding to one layer of the layered composite material; and
obtaining a time-history of structural responses including behaviors of the layered composite materials from the time-marching simulation.

9. The non-transitory computer-readable storage medium of claim 8, said computer performance enhancing techniques comprise a full vectorization computation of said those shell finite elements.

10. The non-transitory computer-readable storage medium of claim 8, said computer performance enhancing techniques comprise a more optimal domain decomposition estimate in parallel processing of said those shell finite elements.

11. A system for obtaining numerically simulated structural behaviors of layered composite materials within a structure in a time-marching simulation using finite element analysis (FEA), the system comprising:
a main memory for storing computer readable code for an application module;
at least one processor coupled to the main memory, said at least one processor executing the computer readable code in the main memory to cause the application module to perform operations by a method of:
receiving a FEA model of a structure containing more than one type of layered composite materials represented by a plurality of shell finite elements, wherein said plurality of shell finite elements are each identified with a single identifier defined by a user that are identified with a single identifier defined by user;
sorted the shell finite element elements by types into a plurality of internal groups such that those shell finite elements in each group are resided in contiguous memory locations of the main memory when a time-marching simulation of the structure is conducted using computer performance enhancement techniques specifically applying to said those shell finite elements, wherein each of the shell finite elements is configured with an arbitrary number of through-thickness integration points with each integration point corresponding to one layer of the layered composite material; and
obtaining a time-history of structural responses including behaviors of the layered composite materials from the time-marching simulation.

12. The system of claim 11, said computer performance enhancing techniques comprise a full vectorization computation of said those shell finite elements.

13. The system of claim 11, said computer performance enhancing techniques comprise a more optimal domain decomposition estimate in parallel processing of said those shell finite elements.

* * * * *